United States Patent [19]

Coppola et al.

[11] 4,086,530
[45] Apr. 25, 1978

[54] DETECTION CIRCUIT FOR MONITORING THE FAILURE OF A SYSTEM TO RESPOND IN A PLANNED MANNER TO AN INPUTTED CONTROL SIGNAL

[75] Inventors: Vincent G. Coppola, North Branford; Flavio M. Manduley, Seymour; Daniel F. Dlugos, Huntington, all of Conn.

[73] Assignee: Pitney-Bowes, Inc., Stamford, Conn.

[21] Appl. No.: 631,167

[22] Filed: Nov. 11, 1975

[51] Int. Cl.² .................. G01R 31/02; G01R 31/28
[52] U.S. Cl. ........................ 324/133; 324/51; 324/57 R
[58] Field of Search ............ 324/51, 133, 57 PS, 324/57 R, 158 D, 158 T, 73, 57 DE, 140, 186; 328/110, 112

[56] References Cited

U.S. PATENT DOCUMENTS

| | | | |
|---|---|---|---|
| 2,618,686 | 11/1952 | De Lange | 324/57 DE |
| 2,793,343 | 5/1957 | Wagner | 324/57 PS |
| 2,891,217 | 6/1959 | Greig et al. | 324/57 R |
| 2,970,258 | 1/1961 | Sinclair | 324/57 R |
| 3,286,175 | 11/1966 | Gerbier et al. | 324/73 R |
| 3,419,799 | 12/1968 | Papadeas | 324/57 R |
| 3,431,490 | 3/1969 | Kwap et al. | 324/186 X |
| 3,483,467 | 12/1969 | Bates | 324/140 RX |
| 3,614,608 | 10/1971 | Giedd et al. | 324/73 R |
| 3,668,523 | 6/1972 | Kuhn | 324/158 D |
| 3,689,830 | 9/1972 | Caldwell et al. | 324/51 |
| 3,699,438 | 10/1972 | Webb | 324/51 X |

*Primary Examiner*—Gerard R. Strecker
*Attorney, Agent, or Firm*—Robert S. Salzman; William D. Soltow, Jr.; Albert W. Scribner

[57] ABSTRACT

A circuit for detecting the failure of a system to respond in a planned manner to a binary control signal includes a circuit for generating a check signal which normally changes in phase with the control signal. The failure detect circuit includes inverters for generating inverted control and check signals. AND gates compare each signal with the inverted form of the other. A NOR gate produces a failure-indicating signal when an equality is sensed.

5 Claims, 4 Drawing Figures

| CONDITION | CONTROL SIGNAL | CHECK SIGNAL |
|---|---|---|
| NORMAL | 0 | 0 |
|  | 1 | 1 |
| COLLECTOR OF 26 GROUNDED | 0 | 1 |
|  | 1 | 1 |
| COLLECTOR OF 26 OPEN | 0 | 1 |
|  | 1 | 1 |
| 24V SHORT TO 26 COLL. | 0 | 0 |
|  | 1 | 0 |

Fig. 3.

| SIGNAL ID | SIGNAL LEVELS | | | |
|---|---|---|---|---|
|  | NORMAL OP. | | FAILURE MODE | |
| CONTROL SIGNAL | 0 | 1 | 0 | 1 |
| CHECK SIGNAL | 0 | 1 | 1 | 0 |
| INP 40 - AND 42 | 0 | 1 | 1 | 0 |
| INP 56 - AND 42 | 1 | 0 | 1 | 0 |
| INP 46 - AND 48 | 1 | 0 | 0 | 1 |
| INP 52 - AND 48 | 0 | 1 | 0 | 1 |
| AND 42 OUT | 0 | 0 | 1 | 0 |
| AND 48 OUT | 0 | 0 | 0 | 1 |
| NOR 58 OUT | 1 | 1 | 0 | 0 |

Fig. 4.

DETECTION CIRCUIT FOR MONITORING THE FAILURE OF A SYSTEM TO RESPOND IN A PLANNED MANNER TO AN INPUTTED CONTROL SIGNAL

BACKGROUND OF THE INVENTION

The present invention relates to failure detection and more particularly to a circuit for detecting the failure of a system to respond in a planned manner to binary control signals.

As electronic systems have become more sophisticated and complex, the risks of tampering or failure with components or circuits have increased. In such systems, component or circuit failure can result in a generated output signal which may be misinterpreted as representing a condition which does not really exist. As a simple example, the failure of a light source for a photocell might result in a signal which would normally be interpreted as an "object absent" signal when in fact an object is present.

The consequences of undetected circuit or component failure are too varied and diverse to discuss other than in a general way. Where the circuit is part of a system for recording costs or financial transactions, indefinite amounts of money may be involved. Where the circuit is part of a control system for machinery or devices, property damage or personal injury may result from undetected circuit or component failure.

Failure detection systems are, of course, known in the art. Such systems are typically complex, expensive, and capable of application only to specific systems.

SUMMARY OF THE INVENTION

The present invention is a failure detect circuit which is inexpensive and which may be employed with minimal changes to check for failures of circuits or components in a variety of systems.

The circuit includes means connected to the system being monitored for producing a check signal which changes in phase with a control signal for the system when the system is functioning normally. The circuit also includes failure detect logic which receives both the control signal and the check signal. The logic includes means for producing inverted forms of the control signal and the check signal and means for simultaneously comparing: (1) a check signal with an inverted form of a control signal; and (2) a control signal with an inverted form of check signal. The failure detect logic further includes means for generating a failure-indicating signal when either comparison shows that the compared signals are of equal value.

DESCRIPTION OF THE DRAWINGS

While the specification concludes with claims particularly pointing out and distinctly claiming that which is regarded as the present invention, details and further advantages of a particular embodiment of the invention may be more readily ascertained from the following detailed description when read in conjunction with the accompanying drawings wherein:

FIG. 3 is a tabulation of binary values of a control signal and a check signal occurring in the present invention in both normal and failure modes of operation; and FIG. 4 is a tabulation of the binary signals generated at selected points in the circuit of FIG. 2 in both normal and failure modes of operation.

DESCRIPTION OF SPECIFIC EMBODIMENTS

Figure 1:
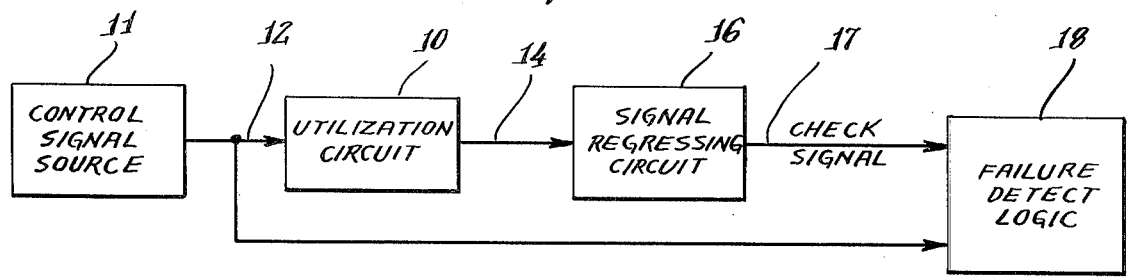
FIG. 1 is a block diagram of the present invention.

Referring now to FIG. 1, a failure detect system constructed in accordance with the present invention is used to determine whether a utilization circuit 10 responds in a planned manner to a binary control signal applied at input 12 by a control signal source 11. The function to be performed by the utilization circuit 10 or the details of its construction are not by themselves critical to the practice of the present invention. Utilization circuit 10 may be any circuit which produces at least one output signal, the characteristics of which are a direct function of changes in the control signal when the circuit 10 is functioning properly. For example, the output may simply be an inverted form of the control signal.

This output signal is applied over lead 14 to a circuit 16 referred to as a signal regressing circuit. The function of signal regressing circuit 16 is to act on signals received over lead 14 to return those output signals to the control signal format and phase when the utilization circuit 10 is functioning properly. For example, if circuit 10 normally causes the output signal on lead 14 to be inverted relative to the control signal, signal regressing circuit 10 would provide a second inversion, thus generating a check signal which varies in phase with the control signal.

The check signal generated by the signal regressing circuit 16 and the control signal at input 12 are applied to failure detect logic 18. The basic function of failure detect logic 18 is to determine whether the signal at an output 17 of signal regressing circuit 16 is changing in phase with changes in the control signal. If not, this is interpreted to indicate a circuit or component malfunction.

Figure 2:
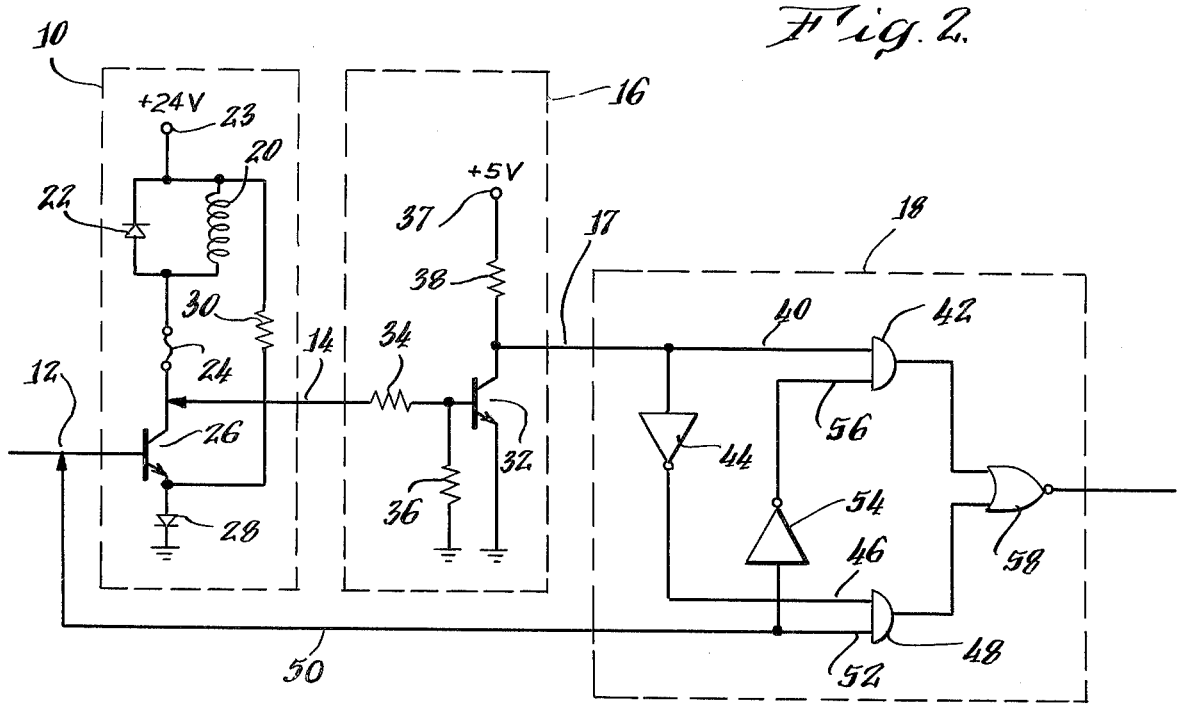
FIG. 2 is a schematic diagram of a preferred embodiment of the present invention.

Referring to FIG. 2, one example of the utilization circuit 10 is a drive circuit for a solenoid-controlled device such as a mechanical counter. A coil 20 for such a solenoid is shown connected in parallel with a freewheeling diode 22 between a 24 volt voltage source 23 and one terminal of a fuse 24. The opposite terminal of the fuse 24 is connected to the collector of a transistor 26. The control signal for the circuit 10 is applied to the base terminal of transistor 26, the emitter terminal of which is connected to ground through diode 28. Emitter bias is provided through a resistor 30 connecting the voltage source 23 to the emitter terminal of transistor 26.

The control signal applied at the base terminal of transistor 26 is binary. When the solenoid is to be energized, a binary one signal drives transistor 26 into conduction to establish a current path from the voltage source through coil 20, fuse 24, transistor 26 and diode 28 to ground. The control signal is switched to a binary zero level when the solenoid is to be de-energized, driving transistor 26 to a non-conductive state to disrupt the current flow. Energy stored in the coil 20 at the time of de-energization is dissipated through the freewheeling diode 22.

In devices such as copying machines or postage meters the solenoid including coil 20 might be used to drive an accumulating counter, which permits a user or lessor of the device to determine how many uses have been made. Such information is useful for different reasons, including establishing a rental charge and/or determining when preventative maintenance or servicing should be performed. Since the operation of such an accumulating counter is ancillary to the primary function of the machine in which it is used, the driving circuit could possibly fail or be disabled without being noticed.

To prevent a disabled counter from going unnoticed, the voltage on the collector of the transistor 26 is monitored. This voltage is applied over a lead 14 to one embodiment of a signal regressing circuit 16. The collector voltage is applied to the base terminal of the transistor 32 through a voltage divider consisting of a resistor 34 connected between the collector terminal of transistor 26 and the base terminal of transistor 32 and another resistor 36 connected between the base terminal and ground. The emitter terminal of transistor 32 is grounded while its collector terminal is connected to a logic voltage source 37 through a resistor 38.

If utilization circuit 10 is functioning properly, changes in the control signal at the base of transistor 26 will be tracked by similar changes in the voltage on the collector terminal of transistor 32. This voltage, appearing on lead 17, is a check signal to be compared to the control signal.

The particular circuit 16 shown in FIG. 2, performs an inversion function. Depending on the operations performed on control signal in a utilization circuit, the functions and structure of any signal regressing circuit may, of course, differ from the illustrated circuit.

The check signal is applied to an input 40 of a first AND gate 42 and through a first inverter 44 to an input 46 of a second AND gate 48. The control signal is applied directly to the failure detect logic through a lead 50 connected to input 52 of AND gate 48, and to a second inverter 54, the output of which provides a second input 56 to the AND gate 42.

The function of the failure detect logic 18 is to compare, simultaneously, the control signal with the inverted form of the control signal. If the comparison shows that the control signal has the same value as the inverted form of the check signal, or that the check singal has the same value as the inverted form of the control signal, a failure is indicated. This is so, because the control signal and the check signal change in phase and are always equal when the circuit is functioning properly.

The comparison of the check signal with the inverted form of the control signal is carried out by AND gate 42. Gate 42 produces a binary 1 output only if the check signal is a binary 1 while the control signal is a binary zero. The comparison of the control signal with the inverted form of the check signal is carried out by the AND gate 52. Gate 52 produces a binary 1 output only if the control signal is a binary 1 while the check signal is a binary zero. As will be discussed later, certain types of component failure might produce a false "no failure" signal at one level of the control signal. For that reason, it is necessary to test for failure at both binary values of the control signal to be certain the check signal is changing in phase with the control signal.

The outputs of AND gates 42 and 48 are applied to a NOR gate 58 which produces a binary 1 output signal if, and only if, both inputs are at binary zero levels. The outpus of AND gates 42 and 48, which are the inputs to the NOR gate 58, are both at binary zero levels only if a utilization circuit 10 is functioning properly. If a failure has occurred, the output of one of the two AND gates will be a binary 1 signal, causing the NOR gate 58 to produce a failure-indicating binary zero signal.

Referring to FIG. 3, the levels of control signals and check signals which can occur in both normal and certain failure modes are tabulated. During normal operation, the check signal always has the same binary values as the control signal; that is, the check signal is a binary 0, while the control signal is a binary 0 but goes to a binary 1 when a control signal goes to a binary 1.

If, however, the collector of transistor 26 were to become grounded for some reason, the low potential on the base terminal of transistor 32 would drive that transistor to a permanently non-conductive state. This would cause the collector voltage (or check signal) to be fixed at a high or binary 1 level, without regard to subsequent changes in the level of the control signal.

Similarly, if the collector transistor 26 were to become open circuited, a relatively low voltage established across resistor 36 would also cause transistor 32 to be driven into non-conduction, driving the collector voltage of that transistor to a fixed, high level. Such an open circuit could be the result of fuse 24 being blown due to accidental or intentional short circuiting of the solenoid coil 20.

If the 24-volt source is connected directly to the collector of transistor 26, either inadvertently or in an attempt to bypass fuse 24, the fixed, high level voltage at the base of transistor 32 maintains that transistor in its conducting state. The voltage applied directly to transistor 26, will cause the fuse to blow when the transistor turns on. This will cause a similar effect as above, when there isn't a solenoid coil 20 in the line. Under these conditions, the check signal on lead 17 remains at a low or binary zero level regardless of changes in level of the control signal.

Since component failures of the type listed will result in fixed level check signals without affecting the control signal, the control signal and the check signal will be equal at one level of control signal, resulting in a false "no failure" signal. For example, where the collector of transistor 26 is open circuited, the fixed binary 1 signal on lead 17 will produce a "no failure" indication when the control signal is at a binary 1 level. However, the failure is detected by also comparing the check signal to the control signal when the control signal is a binary 0.

Referring to FIG. 4, the signals generated at specified points within failure detect logic 18 in both a normal mode and a failure mode of operation are tabulated. For example, the first column of binary numbers represent the inputs to, and outputs from, the AND gates, and the output from the NOR gate during a normal mode of operation, where the control signal is a binary 0. The second column represents the same inputs and outputs where the control signal is a binary 1 signal. Whether the control signal is a binary or a binary one during normal operation, the outputs of both AND gates 42 and 48 are at binary 0 levels.

The third column represents inputs and outputs where the check signal remains at a binary 1 level, although the control signal is at a binary 0 level. Under these conditions, which can exist when the collector of transistor 26 is either grounded or open (and for other failure conditions), AND gate 42 produces a binary 1 signal, causing the NOR gate 58 to generate a failure-indicating binary zero output.

The fourth column represents input and output signal levels where the check signal remains at a binary 0 level when the control signal goes to a binary 1 level. This is a condition which can occur when the collector of transistor 26 is connected directly to the 24 volt source, or where the collector of transistor 32 is open-circuited providing a direct connection between lead 17 and the logic voltage source 37. Under these conditions, AND gate 48 generates a binary 1 output, causing the NOR gate 58 to generate a failure-indicating binary zero output.

While there has been described what is considered to be a preferred embodiment of the invention, variations and modifications therein will occur to those skilled in the art once they become aware of the basic concepts of the invention. Therefore, it is intended that the appended claims shall be construed to include all such variations and modifications as fall within the true spirit and scope of the invention.

What is claimed is:

1. A detection circuit for monitoring the failure of a system to respond in a planned manner to an inputted control signal, comprising:
    a control signal source for providing a control signal to the system being monitored;
    a signal phasing circuit connected to the output of said system being monitored for producing a check signal which changes in phase with said control signal, when said system is operating normally, and
    failure detect logic means coupled to said control signal source and said signal phasing circuit for respectively receiving said control signal and said check signal and operating upon these signals to indicate a failure in said system, said logic means including:
    A. inverter means for producing an inverted control signal and an inverted check signal;
    B. comparing means for receiving the control signal, the check signal, and the inverted signals for comparing: first, the check signal with the inverted control signal; and second, the control signal with the inverted check signal; and
    C. indicating means connected to said comparing means for generating a failure-indicating signal when both of the first and second comparisons are equal.

2. A failure detect circuit as recited in claim 1 wherein said inverter means comprises:
    a. a first inverter having an input from said check signal producing means and an output coupled to said comparing means; and
    b. a second inverter having an input coupled to the control signal source and an output coupled to said comparing means.

3. A failure detect circuit as recited in claim 2 wherein said comparing means comprises:
    a. a first AND function gate having inputs from said signal phasing circuit and from the output of said second inverter; and
    b. a second AND function gate having inputs from the source of the control signal and from the output of said first inverter.

4. A failure detect circuit as recited in claim 3 wherein said indicating means comprises a NOR gate having inputs from said AND gate and said second AND gate.

5. A detection circuit for monitoring the failure of a system to respond in a planned manner to an inputted control signal, comprising:
    a control signal source for providing a control signal to the system being monitored;
    a signal phasing circuit connected to said system being monitored for producing a check signal which changes in phase with said control signal, when said system is operating normally, said signal phasing circuit forming a loop between said system being monitored and an inverter means;
    inverter means coupled to said control signal source and said phasing circuit for respectively producing an inverted control signal and an inverted check signal;
    comparing means coupled to said control signal source, said signal phasing circuit, and said inverter means for comparing the signals received therefrom; and
    indicating means connected to said comparing means for indicating a failure of said system in response to a given comparison of said comparing means.

* * * * *